United States Patent [19]

Iizuka

[11] Patent Number: 4,462,090

[45] Date of Patent: Jul. 24, 1984

[54] METHOD OF OPERATING A SEMICONDUCTOR MEMORY CIRCUIT

[75] Inventor: Hisakazu Iizuka, Yokohama, Japan

[73] Assignee: Tokyo Shibaura Denki Kabushiki Kaisha, Kawasaki, Japan

[21] Appl. No.: 393,608

[22] Filed: Jun. 30, 1982

Related U.S. Application Data

[63] Continuation of Ser. No. 103,375, Dec. 13, 1979.

[30] Foreign Application Priority Data

Dec. 14, 1978 [JP] Japan ............................ 53-153741

[51] Int. Cl.³ ................. G11C 11/40; H01L 29/78; H01L 27/02; H01L 29/04
[52] U.S. Cl. ............................. 365/185; 357/23.5; 357/23.12; 357/41; 357/54; 357/59
[58] Field of Search ............... 357/23 VT, 41, 54, 59; 365/185

[56] References Cited

U.S. PATENT DOCUMENTS

| | | | |
|---|---|---|---|
| 3,728,695 | 4/1973 | Frohman-Bentchkowsky | 357/23 VT |
| 3,825,945 | 7/1974 | Masuoka | 357/23 VT |
| 3,836,992 | 9/1974 | Abbas et al. | 357/41 |
| 4,051,464 | 9/1977 | Huang | 365/185 |
| 4,099,196 | 7/1978 | Simko | 357/41 |
| 4,122,544 | 10/1978 | McElroy | 357/23 VT |
| 4,258,378 | 3/1981 | Wall | 357/41 |

OTHER PUBLICATIONS

Das Gupta et al., "Dual-Gate FAMOS Memory Cell", IBM Technical Disclosure Bulletin, vol. 17, (1/75), p. 2266.
Iizuka et al., "Electrically Alterable Avalanche-Injection-Type MOS Read-Only Memory with Stacked-Gate Structure", IEEE Trans. Electron Devices, vol. ED-23, (4/76), pp. 379–387.

*Primary Examiner*—Gene M. Munson
*Attorney, Agent, or Firm*—Oblon, Fisher, Spivak, McClelland & Maier

[57] ABSTRACT

Disclosed is a semiconductor memory element having a semiconductor substrate of P conductivity type, source and drain regions which are of N conductivity type and formed in the substrate, a first gate insulation layer formed on the major surface of the substrate, corresponding to a channel region located between the source and drain, a floating gate electrode formed on the first gate insulation layer so as to partially overlap the channel region, a second gate insulation layer formed on the floating gate electrode, a control gate electrode formed on the second gate insulation layer so as to partially overlap the floating gate electrode, and an addressing gate electrode formed on the control gate electrode, extending to a portion of the channel region not covered by the floating gate electrode and the control gate electrode.

2 Claims, 20 Drawing Figures

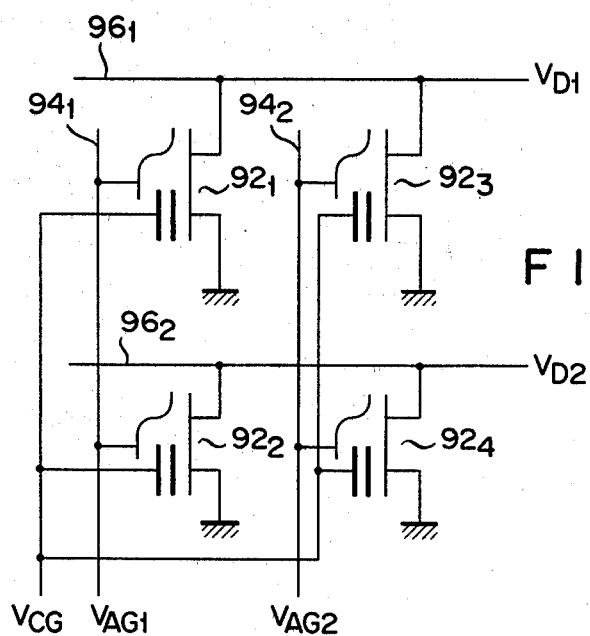
FIG. 9
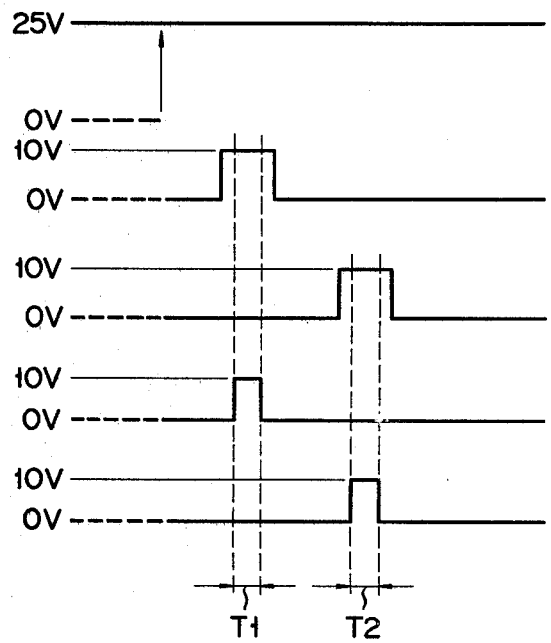
FIG. 10A $V_{CG}$
FIG. 10B $V_{D1}$
FIG. 10C $V_{D2}$
FIG. 10D $V_{AG1}$
FIG. 10E $V_{AG2}$

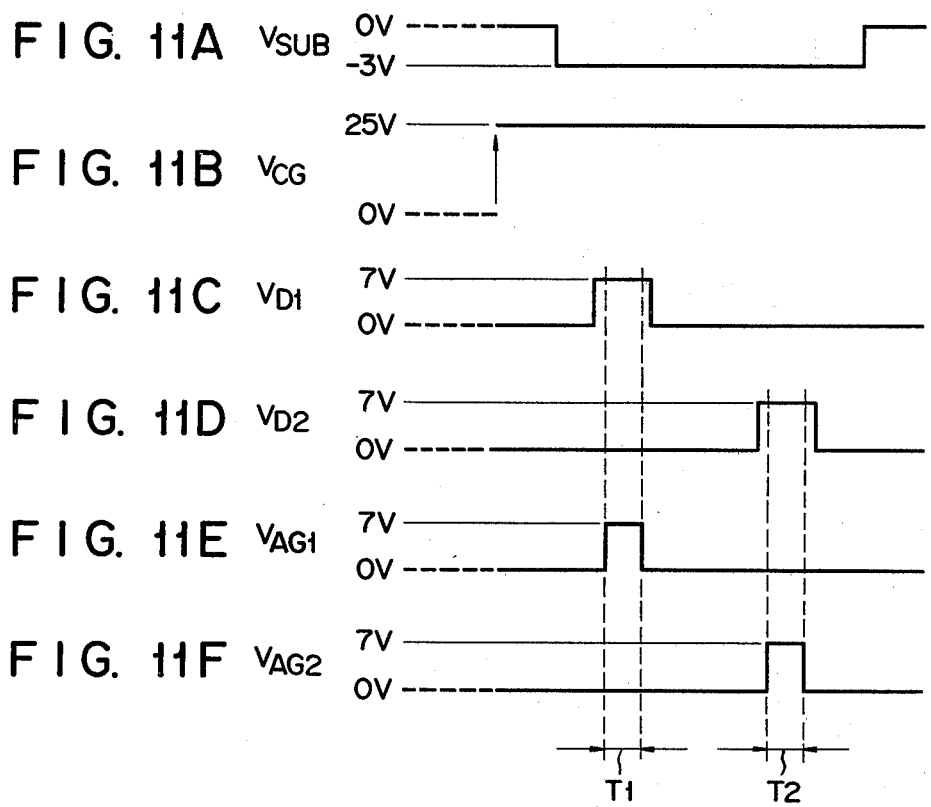

METHOD OF OPERATING A SEMICONDUCTOR MEMORY CIRCUIT

This is a continuation of application Ser. No. 103,375, filed Dec. 13, 1979.

BACKGROUND OF THE INVENTION

This invention relates to a semiconductor memory element of MOS type of which the contents may be electrically rewritten and, more particularly, to a memory circuit having the memory elements arranged in a matrix fashion.

The MOS type memory allowing the rewrite of the contents thereof has well been known and has the following construction. Source and drain regions are formed in a semiconductor substrate of P conductivity type. A first electrode as a floating gate electrode is formed on a channel region between the source and the drain region with a first insulation layer interposed between the first electrode and the channel region. A second gate electrode as a control gate is further formed on the first gate electrode with a second insulation layer interposed between both.

In the write operation, a positive voltage (20 V or more) is applied to the control gate electrode while at the same time a positive voltage is applied to the drain. The transistor operates in a saturation region. Under this condition, an N-channel is formed between the source and the drain. High energy potential electrons arising from inpact ionization in the N-channel region are injected into the first and second insulation layers and attracted toward the control gate electrode with the positive voltage impressed. At this time, the electrons are trapped by the floating gate electrode so that the N-channel disappears and the MOS transistor is turned off. The write operation is carried out as described above.

In the conventional MOS transistor as a memory element, the read operation is at relatively high speed, but the write operation is at low speed, that is to say, it takes a relatively long time, about 2 ms. Further, the voltages applied to the drain and the control gate in the write operation is high, e.g. 20 V or more. This is disadvantageous in fabricating the memory device having the memory elements of this type with high density and large memory capacity.

In the conventional memory element, in order to improve the efficiency of the electron injection into the floating gate, the floating gate electrode is greatly extended into the field region so that a capacitance between the control gate and the floating gate can be larger than that between the floating gate and the substrate and the electric field in the first insulation layer becomes large enough to increase the electron injection. This results in a bulky memory element and therefore is disadvantageous in fabricating the integrated circuit with high density.

SUMMARY OF THE INVENTION

Accordingly, an object of the invention is to provide a semiconductor memory element of MOS type with a decreased write voltage and shortened write time.

Another object of the invention is to provide a memory circuit having the MOS memory elements which effects the write operation at decreased voltage and for shortened time.

According to one aspect of the invention, there is provided a semiconductor memory element comprising: a semiconductor substrate of a first conductivity type; source and drain regions which are formed in the semiconductor substrate and are of a second conductivity type opposite to that of the first conductivity; a first gate insulation layer formed on the major surface of the substrate, corresponding to a channel region between the source and the drain; a first gate electrode formed on the first gate insulation layer so as to partially overlap the channel region; a second gate insulation layer formed on the first gate electrode; a second gate electrode formed on the second gate insulation layer so as to partially overlap the first gate electrode; a third gate insulation layer formed on the second gate electrode; and a third gate electrode formed on the third gate insulation layer, extending to a portion of the channel region not covered by the first and second gate electrodes.

According to another aspect of the invention, there is provided a semiconductor circuit having a plurality of memory elements in a matrix fashion, each memory element including a semiconductor substrate of a first conductivity type, source and drain regions which are formed in the semiconductor substrate and are of a second conductivity type opposite to that of the first conductivity, a first gate insulation layer formed on the major surface of the substrate, corresponding to a channel region between the source and the drain, a first gate electrode formed on the first gate insulation layer so as to partially overlap the channel region, a second gate insulation layer formed in the first gate electrode, a second gate electrode formed on the second gate insulation layer so as to partially overlap the first gate electrode, a third gate insulation layer formed on the second gate electrode, and a third gate electrode formed on the third gate insulation layer, extending to a portion of the channel region not covered by the first and second gate electrodes, wherein the second gate electrodes of the semiconductor memory elements are commonly connected to one another, the drain regions of the memory elements arranged on a row of the matrix are commonly connected one another, the third gate electrodes of the memory elements arranged on a column are commonly connected one another.

According to yet another aspect of the invention, there is provided an operation method used in the memory circuit mentioned above comprising a step for applying, in advance of applying data writing signals, a fixed voltage to the second gate electrode of each memory element in the write mode for writing data into the respective memory elements; and a step for applying pulse voltages as the data writing signals to the drain region and the third gate electrode of the memory element, respectively, to be selected at a write timing.

Other objects and features of the invention will be apparent from the following description taken in connection with the accompanying drawings, in which:

BRIEF DESCRIPTION OF THE DRAWINGS

FIG. 9 shows a circuit diagram of a memory circuit having a plurality of the above-mentioned type memory elements as an embodiment of the invention;

FIGS. 10A to 10E show a set of timing charts of various voltage signals applied useful in explaining a data write operation by the memory circuit shown in FIG. 9; and FIGS. 11A to 11F show a set of timing charts of various voltage signals applied useful in explaining another data write operation by the memory circuit in FIG. 9.

DETAILED DESCRIPTION OF THE PREFERRED EMBODIMENT

Figure 1:
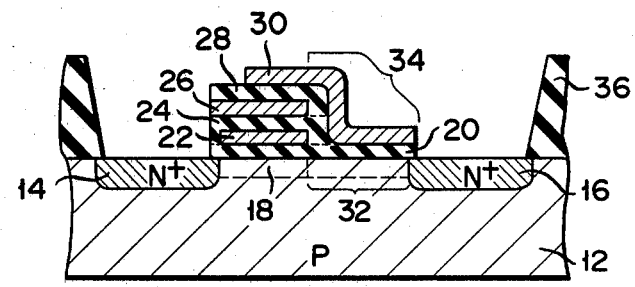
FIG. 1 shows a cross sectional view of an embodiment of a semiconductor memory element according to the invention.

Referring now to FIG. 1, there is shown an embodiment of a MOS type semiconductor memory element according to the invention. In the figure, reference numeral 12 designates a semiconductor substrate of P conductivity type, for example, which is made of silicon. In the semiconductor substrate 12, source and drain regions 14 and 16 having high impurity concentration are embedded with a suitable interval therebetween as shown. The conductivity of the source and drain regions 14 and 16 is of N type which is opposite to that (P type) of the substrate 12. On the major surface of the substrate 12, located at an N channel region 18 between the source and drain regions 14 and 16, a floating gate electrode 22 as a first gate electrode is partially formed, being self-aligned with the source region 14, with a silicon oxide film ($SiO_2$) 20 as a first gate insulation layer which is layered between the major surface and the floating gate electrode 22. The floating gate electrode 22 may be made of polycrystalline silicon (poli-silicon) and may be prepared by the chemical vapor deposition (CVD) process, for example. A control gate electrode 26 as a second gate electrode is layered on the floating gate electrode 22 with an interposition therebetween of a second gate insulation layer 24 preferably having the same construction as that of the first insulation layer 20. An addressing gate electrode 30 as a third gate electrode is layered over a third gate insulation layer 28 preferably having the same construction as that of the first or second gate insulation layer, which also is layered over the control gate electrode 26. The addressing gate electrode 30 includes an extension 34 (e.g. 3 μm) extending over the portion of the first insulation layer 20 which is located on the channel region 18 not covered by the floating gate electrode 22 and the control gate electrode 26. A field insulation film 36 is formed on the field region of the substrate 12.

The floating gate electrode 22, the control gate electrode 26 and the addressing gate electrode 30 may be made of impurity doped poly-silicon. Particularly, the addressing gate electrode 30 may be made of aluminium (Al), refractory metal or metal silicide.

Figure 2:
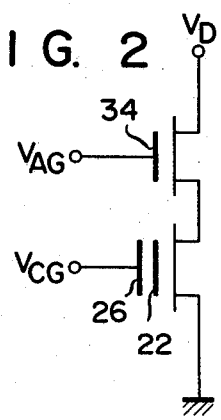
FIG. 2 shows an equivalent circuit of the memory element shown in FIG. 1.

FIG. 2 shows an equivalent circuit of the memory element shown in FIG. 1.

In the data write operation, a DC voltage $V_{CG}$, +25 V, for example, is applied in advance of applying data writing signals to the control gate 26. At the data write, a drain pulse voltage $V_D$ of about 10 V and an addressing pulse voltage $V_{AG}$ of about 10 V are applied as the data writing signals to the drain region 16 and the addressing gate electrode 30 respectively. Since the voltage $V_{CG}$ of about +25 V is applied in advance of applying the data writing signals to the control gate 26, and the extension 34 of the addressing gate 30 is disposed closer to the substrate 12, the addressing pulse voltage $V_{AG}$ at the time of the data write may be low, for example, about +10 V. Further, since the effective channel length is reduced to the length of the portion 32 corresponding to the extension 34 of the addressing electrode 30, the drain voltage $V_D$ may also be low, +10 V, for example. The memory element shown in FIG. 1 operates in the saturation region with such low voltages $V_{AG}$ and $V_D$, to form an N channel ranging from the source region 14 to the drain region 16. The electrons moving through the N channel causes an impact ionization in the N channel due to a high electric field in the channel to thereby produce hot electrons of high energy. Part of those hot electrons are injected into the gate insulation layers 20, 24 and 28. During the moving, the electrons are trapped by the floating gate provided between the substrate 112 and the control gate electrode 26. Data is written into the memory element in this way. In data read operation, the addressing pulse voltage $V_{AG}$ is applied to the addressing gate 30 to form a channel in the substrate 12 under the extension 34 of the addressing gate electrode 30 thus to have the knowledge on the conduction or non-conduction state between the source region 14 and the drain region 16.

For the erasure of the stored data, positive or negative high voltage, about 50 (V), for example, is applied to the control gate electrode 26 to remove the electrons due to a tunnel emission of Fowler-Nordheim type.

Figure 3:
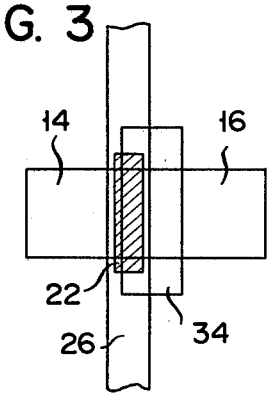
FIG. 3 shows a plan view of the memory element shown in FIG. 1.

In the memory element of FIG. 1, in advance of applying data writing signals, the voltage $V_{CG}$ of about $+\cong V$ is applied to the control gate electrode 26 in the data write and the effective length of the channel is reduced. Therefore, the writing speed of the memory may be improved up to within 500 μs. Further, the memory element of the invention allows the use of low voltage for the addressing pulse voltage $V_{AG}$ and the drain voltage $V_D$ at the time of the data write. For this, the integration density of the memory circuit having a plurality of the memory elements and the integration density of its peripheral circuits can be improved. Further, in the data write, the voltage $V_{CG}$ is applied in advance of applying the data writing signals to the control gate electrode 26. This feature eliminates the large floating gate electrode 22 greatly extending over the field region to gain a large capacitance, unlike the conventional memory element. Accordingly, the floating gate electrode 22 merely extends to the field region by a slight amount of distance, as shown in FIG. 3. Also in this point, the memory element is suitable for high density integration.

Figure 4:
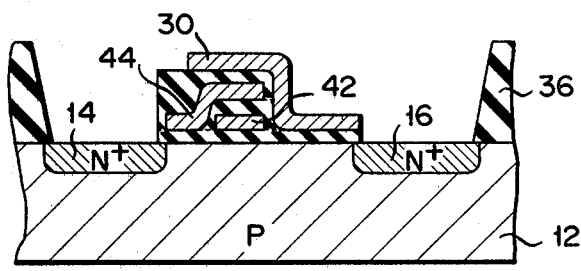
FIGS. 4 and 5 show cross sectional views of the memory elements of other embodiments of the invention, which are depicted in a similar way to that in FIG. 1.
Figure 5:
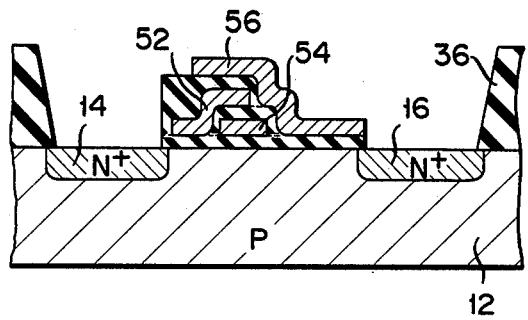

FIGS. 4 and 5 show other embodiments of the memory elements according to the invention. Those embodiments are basically the same as that in FIG. 1 and accordingly, like numerals are used to designate like portions in FIG. 1. Only the different portions from the FIG. 1 embodiment will be described.

In the embodiment in FIG. 4, the floating gate electrode 42 is not self-aligned with the source region. In other words, the floating gate electrode 42 does not extend to the side edge of the source region 14 closer to the drain region 16. An extension of the control gate electrode 44 extending over the first insulation layer 20 intervenes between the floating gate electrode 42 and the source region 14. The extension of the control gate 44 is self-aligned with the source region 14.

In the embodiment in FIG. 5 having the same construction as that of the FIG. 4 embodiment, the control gate electrode 52 does not cover the entire of the floating gate electrode 54. That is, the control gate electrode 54 is absent at a portion of the floating gate electrode 54 closer to the drain region 16. The addressing gate electrode 56 extends over the control-gate-electrode absent portion of the floating gate electrode 54.

Those embodiments in FIGS. 4 and 5 may attain the same effects as those attained by the FIG. 1 embodiment.

Figure 6:
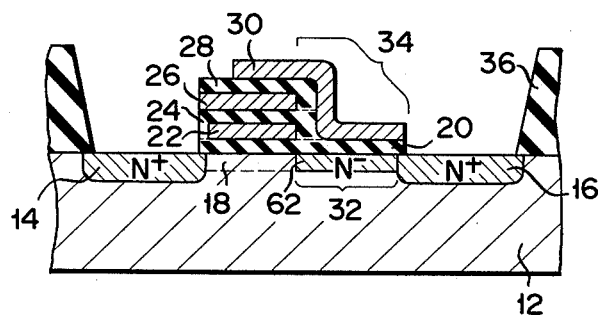
FIG. 6 shows a cross sectional view of the memory element as another embodiment of the invention.

Turning now to FIG. 6, there is shown another embodiment of the memory element of the invention. The feature of the embodiment resides in the use of an N⁻ region 62 with a low impurity concentration in the surface area of the substrate 12, corresponding to the extension 34 of the addressing gate electrode 30 in FIG. 1. The N⁻ region 62 is of the same conductivity type as that of the source and drain regions 14 and 16. The N⁻ region 62 may be prepared by the ion injection method, the thermal diffusion method using the ion implantation, gas or solid diffusion source, or the combination of those methods.

The provision of the N⁻ region 62 facilitates the formation of an N channel and makes the channel current path closer to the surface. For this, carriers move through a portion of the N channel in the vicinity of the major surface of the substrate, so that carriers may effectively be injected into the gate insulation layers and trapped by the floating gate electrode 20. This feature further shortens the write time.

Figure 7:
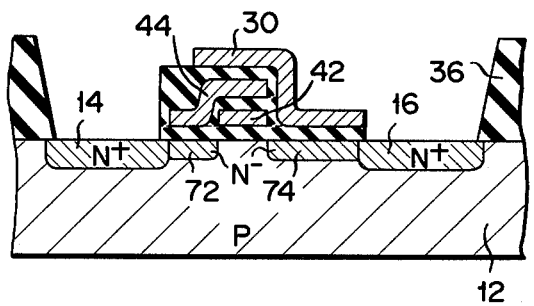
FIGS. 7 and 8 show cross sectional views of the memory elements as other embodiments of the invention, which are displayed in a similar way to that in FIG. 6.
Figure 8:
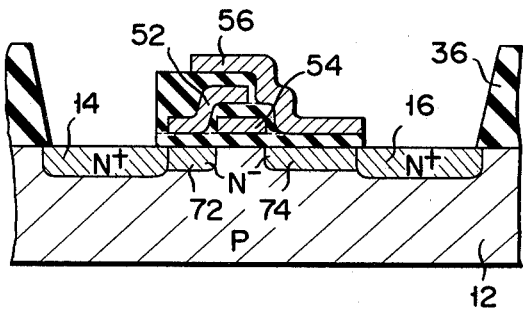

Turning now to FIGS. 7 and 8, other embodiments of the memory element according to the invention are shown. The features of these embodiments reside in that the N⁻ regions 72 and 74 are formed in the surface areas of the substrate 12 under the extensions of the control gate electrode and the addressing gate electrode in the embodiments in FIGS. 4 and 5, as in the embodiment in FIG. 6. The N⁻ regions 72 and 74 are the same conductivity type as that of the source 14 and drain 16 and have lower impurity concentration. Those embodiments can attain the shortening of the write time, satisfactorily.

FIG. 9 shows a memory circuit having a plurality of memory elements as mentioned above arranged in a matrix fashion, which is an embodiment of the invention. In the embodiment, only four memory elements $92_1$ to $92_4$ are used for simplicity. The control gates of these memory elements $92_1$ to $92_4$ are commonly connected to one another, and have a DC voltage $V_{CG}$ of +25 V, for example, during memory writing. The address gate electrodes of the memory elements $92_1$ to $92_2$ arranged on a column of the memory matrix are connected commonly to a first column line $94_1$ coupled with a pulse voltage $V_{AG1}$ for addressing. Similarly, the addressing gate electrodes of the memory elements $92_3$ and $92_4$ arranged on another column are commonly connected to a second column line $94_2$ coupled with an address pulse voltage $V_{AG2}$. The drains of the memory elements $92_1$ and $92_3$ arranged on a row of the matrix are connected commonly to a first row line $96_1$ coupled with a pulse drain voltage $V_{D1}$ of about 10 V for memory writing. Similarly, the drains of the memory elements $92_2$ and $92_4$ arranged on another row are commonly connected to a second row line $96_2$ of a pulse drain voltage $V_{D2}$ of about 10 V for memory writing.

In operation, a desired address is specified by selecting the corresponding column and row lines and data is written into or read out from the address specified.

FIGS. 10A to 10E show wave forms at the respective portions of the memory circuit shown in FIG. 9 in the write mode. In those figures, a period T1 is a write period for the memory element $92_1$ and a period T2 is a write period for the memory element $92_4$. There will now be described how to write data into the memory element $92_4$. Before data is written into the respective memories $92_1$ to $92_4$, the gate voltage $V_{CG}$ of +25 V as shown in FIG. 10A is applied to the control gates of the memory elements $92_1$ to $92_4$. In writing data into the memory element $92_1$, the pulse drain voltage $V_{D1}$ as shown in FIG. 10B of about 10 V is then applied to the row line $96_1$ at a given timing. Within the duration of the drain pulse voltage $V_{D1}$, the addressing pulse $V_{AG1}$ of about 10 V as shown in FIG. 10D is applied to the first column line $94_1$. As a result, the memory element $92_1$ is specified, which is located at the cross point of the row and column lines $96_1$ and $94_1$. Then, data is written into the specified memory. For writing data into the memory element $92_4$, the addressing pulse voltage $V_{AG1}$ and the drain pulse voltage $V_{D2}$ as shown in FIGS. 10C and 10E are applied to the column line $94_2$ and the row line $96_2$, respectively.

In order to prevent an erroneous data write, it is preferable that the addressing pulse voltage $V_{AG}$ ($V_{AG1}$, $V_{AG2}$, . . . ) applied to the column line 94 ($94_1$, $94_2$, . . . ) rises later than the pulse $V_D$ ($V_{D1}$, $V_{D2}$, . . . ) applied to the row line 96 ($96_1$, $96_2$, . . . ) and falls earlier than the latter.

FIGS. 11A to 11F illustrate another write operation different from that shown in FIGS. 10A to 10E. The major difference of this data write method resides in that a reverse bias voltage $V_{SUB}$ of about −3 V as shown in FIG. 11A is applied between the substrate 12 and the source region 14. This feature prevents punch-through from occurring in the memory element, improves the density of integration, shortens the write time, and prevents the erroneous data write.

What is claimed is:

1. A method of operating a semiconductor memory circuit comprising: a plurality of memory elements in a matrix fashion with each memory element including a semiconductor substrate of a first conductivity type, source and drain regions which are formed in the semiconductor substrate and are of a second conductivity type opposite to that of said first conductivity, a first gate insulation layer formed on the major surface of said substrate, corresponding to a channel region between said source and drain, a first gate electrode acting as a floating gate electrode formed on said first gate insulation layer, the first gate electrode located nearer said source region than said drain region, a second gate insulation layer formed on said first gate electrode, a second gate electrode acting as a control gate electrode formed on said second gate insulation layer so as to partially overlap said first gate electrode, a third gate insulation layer formed on said second gate electrode, and a third gate electrode acting as an addressing gate electrode formed on said third gate insulation layer, extending to a portion of said channel region not covered by said first and second electrodes, wherein said second gate electrodes of said semiconductor memory elements are commonly connected to one another, the drain regions of said memory elements arranged on a row/column of said matrix are commonly connected to one another, said third gate electrodes of said memory elements arranged on a column/row are commonly connected to one another including the steps of:

applying, in advance of applying data write signals, a fixed voltage to said second gate electrode of each of said memory elements in the write mode for writing data into said respective memory elements; and applying pulse voltages as the data writing signals to the drain region and said third gate electrodes of the memory element, respectively, to be selected at a write timing.

2. The method of claim 1 further including the step of;

applying a positive or negative high voltage to said second gate electrode of said each memory element in the erasing mode for erasing the data stored.

* * * * *